(12) United States Patent
Singh et al.

(10) Patent No.: US 11,955,376 B2
(45) Date of Patent: *Apr. 9, 2024

(54) ETCH DAMAGE AND ESL FREE DUAL DAMASCENE METAL INTERCONNECT

(71) Applicant: Taiwan Semiconductor Manufacturing Company, Ltd., Hsin-Chu (TW)

(72) Inventors: Sunil Kumar Singh, Hsinchu (TW); Chung-Ju Lee, Hsinchu (TW); Tien-I Bao, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 32 days.

This patent is subject to a terminal disclaimer.

(21) Appl. No.: 17/518,885

(22) Filed: Nov. 4, 2021

(65) Prior Publication Data

US 2022/0059404 A1 Feb. 24, 2022

Related U.S. Application Data

(60) Division of application No. 16/426,074, filed on May 30, 2019, now Pat. No. 11,171,041, which is a
(Continued)

(51) Int. Cl.
*H01L 21/4763* (2006.01)
*H01L 21/768* (2006.01)
(Continued)

(52) U.S. Cl.
CPC .. *H01L 21/76807* (2013.01); *H01L 21/76808* (2013.01); *H01L 21/7682* (2013.01);
(Continued)

(58) Field of Classification Search
CPC .......... H01L 21/76807; H01L 21/7682; H01L 21/76835; H01L 21/76877;
(Continued)

(56) References Cited

U.S. PATENT DOCUMENTS 6,406,992 B1 6/2002 Mao et al.
6,448,177 B1 9/2002 Morrow et al.
(Continued)

FOREIGN PATENT DOCUMENTS

CN 102376597 A 3/2012
KR 20020011476 A 2/2002
(Continued)

OTHER PUBLICATIONS

Notice of Allowance dated Oct. 11, 2013 for U.S. Appl. No. 13/526,640.
(Continued)

*Primary Examiner* — Theresa T Doan
(74) *Attorney, Agent, or Firm* — Eschweiler & Potashnik, LLC

(57) ABSTRACT

Some embodiments relate to a semiconductor device disposed on a semiconductor substrate. A dielectric structure is arranged over the semiconductor substrate. First and second metal vias are disposed in the dielectric structure and spaced laterally apart from one another. First and second metal lines are disposed in the dielectric structure and have nearest neighboring sidewalls that are spaced laterally apart from one another by a portion of the dielectric structure. The first and second metal lines contact upper portions of the first and second metal vias, respectively. First and second air gaps are disposed in the portion of the dielectric structure. The first and second air gaps are proximate to nearest neighboring sidewalls of the first and second metal lines, respectively.

20 Claims, 4 Drawing Sheets

Related U.S. Application Data continuation of application No. 15/726,590, filed on Oct. 6, 2017, now Pat. No. 10,312,136, which is a continuation of application No. 15/083,484, filed on Mar. 29, 2016, now Pat. No. 9,786,549, which is a division of application No. 14/146,941, filed on Jan. 3, 2014, now Pat. No. 9,318,377, which is a division of application No. 13/526,640, filed on Jun. 19, 2012, now Pat. No. 8,652,962.

(51) Int. Cl.
  *H01L 23/48* (2006.01)
  *H01L 23/522* (2006.01)
  *H01L 23/532* (2006.01)

(52) U.S. Cl.
  CPC .. *H01L 21/76835* (2013.01); *H01L 21/76877* (2013.01); *H01L 21/76879* (2013.01); *H01L 21/76885* (2013.01); *H01L 23/481* (2013.01); *H01L 23/5222* (2013.01); *H01L 23/53238* (2013.01); *H01L 23/5329* (2013.01); *H01L 23/53295* (2013.01); *H01L 21/76814* (2013.01); *H01L 21/76831* (2013.01); *H01L 2221/1026* (2013.01); *H01L 2221/1031* (2013.01); *H01L 2221/1036* (2013.01); *H01L 2221/1047* (2013.01); *H01L 2924/0002* (2013.01)

(58) Field of Classification Search
  CPC ............. H01L 21/76879; H01L 23/481; H01L 23/53238; H01L 23/5329; H01L 23/53295; H01L 21/76831; H01L 2221/1031; H01L 2221/1036; H01L 2221/1047; H01L 21/768; H01L 21/28
  USPC ........................................................ 257/758
  See application file for complete search history.

(56) References Cited

U.S. PATENT DOCUMENTS

| | | | |
|---|---|---|---|
| 6,909,128 | B2 | 6/2005 | Ireland |
| 8,652,962 | B2 | 2/2014 | Singh et al. |
| 11,171,041 | B2 * | 11/2021 | Singh ................ H01L 21/76807 |
| 2005/0142853 | A1 | 6/2005 | Tu |
| 2007/0007657 | A1 | 1/2007 | Hineman et al. |
| 2007/0111508 | A1 * | 5/2007 | Hayashi ............ H01L 21/76802 438/622 |
| 2009/0001594 | A1 * | 1/2009 | Yoo ..................... H01L 23/5222 257/773 |
| 2009/0042383 | A1 | 2/2009 | Kim et al. |
| 2009/0174067 | A1 | 7/2009 | Lin |
| 2010/0055897 | A1 | 3/2010 | Chou et al. |
| 2011/0163415 | A1 | 7/2011 | Park |

FOREIGN PATENT DOCUMENTS

| | | |
|---|---|---|
| KR | 100818108 B1 | 3/2008 |
| KR | 20090014628 A | 2/2009 |
| TW | I284944 B | 8/2007 |

OTHER PUBLICATIONS

Non-Final Office Action dated May 18, 2015 for U.S. Appl. No. 14/146,941.
Final Office Action dated Sep. 17, 2015 for U.S. Appl. No. 14/146,941.
Notice of Allowance dated Dec. 15, 2015 for U.S. Appl. No. 14/146,941.
Non-Final Office Action dated Nov. 14, 2016 for U.S. Appl. No. 15/083,484.
Final Office Action dated Mar. 24, 2017 for U.S. Appl. No. 15/083,484.
Notice of Allowance dated Jun. 8, 2017 for U.S. Appl. No. 15/083,484.
Non-Final Office Action dated Oct. 1, 2018 for U.S. Appl. No. 15/726,590.
Final Office Action dated Feb. 7, 2019 for U.S. Appl. No. 15/726,590.
Notice of Allowance dated Apr. 11, 2019 for U.S. Appl. No. 15/726,590.
Non-Final Office Action dated Feb. 3, 2021 for U.S. Appl. No. 16/426,074.
Notice of Allowance dated Jul. 12, 2021 for U.S. Appl. No. 16/426,074.

* cited by examiner

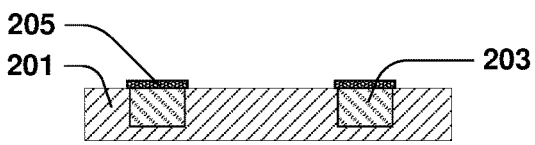
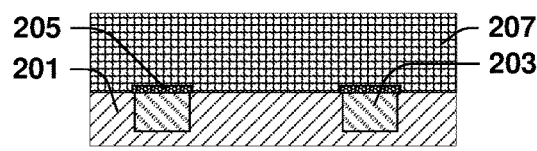
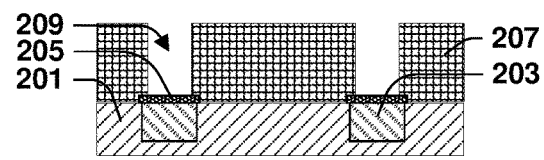
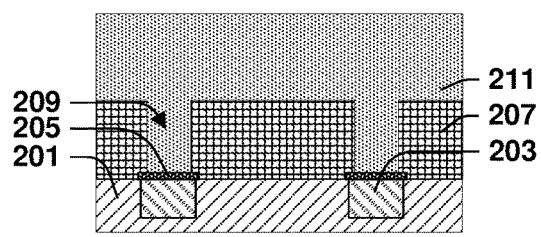
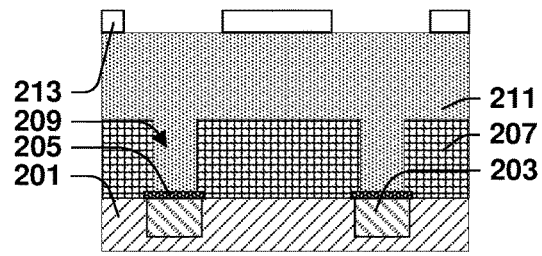
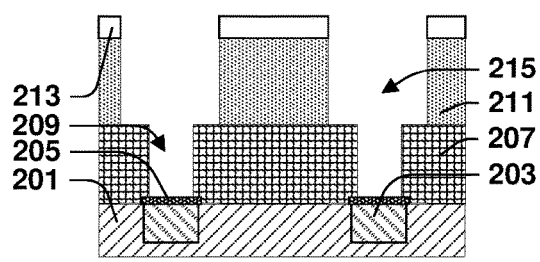
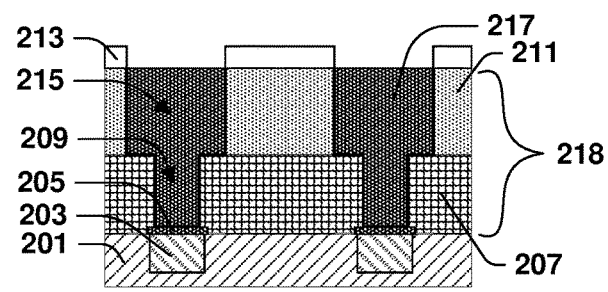

ETCH DAMAGE AND ESL FREE DUAL DAMASCENE METAL INTERCONNECT

REFERENCE TO RELATED APPLICATIONS

This Application is a Divisional of U.S. application Ser. No. 16/426,074, filed on May 30, 2019, which is a Continuation of U.S. application Ser. No. 15/726,590, filed on Oct. 6, 2017 (now U.S. Pat. No. 10,312,136, issued on Jun. 4, 2019), which is a Continuation of U.S. application Ser. No. 15/083,484, filed on Mar. 29, 2016 (now U.S. Pat. No. 9,786,549, issued on Oct. 10, 2017), which is a Divisional of U.S. application Ser. No. 14/146,941, filed on Jan. 3, 2014 (now U.S. Pat. No. 9,318,377, issued on Apr. 19, 2016), which is a Divisional of U.S. application Ser. No. 13/526,640, filed on Jun. 19, 2012 (now U.S. Pat. No. 8,652,962, issued on Feb. 18, 2014). The contents of the above-referenced Patent Applications are hereby incorporated by reference in their entirety.

FIELD

The present disclosure relates to semiconductor devices and more particularly to processes for forming dual damascene metal interconnects that include an extremely low-k dielectric, resulting structures, and devices including those structures.

BACKGROUND

Many years of research have been devoted to reducing the critical dimensions (CDs) and structure densities of integrated circuits (ICs). As densities have increased, the resistance capacitance (RC) delay time has become a limiting factor in circuit performance. To reduce the RC delay, there has been a desire to replace the dielectrics in damascene metal interconnect structures with materials having lower dielectric constants. Such materials are referred to as low-k and extremely low-k dielectrics. A low-k dielectric is a material having a smaller dielectric constant than $SiO_2$. $SiO_2$ has a dielectric constant of about 4.0. An extremely low-k dielectric is a material having a dielectric constant of about 2.1 or less.

The theoretical advantages of using extremely low-k dielectrics in damascene metal interconnect structures have been offset by the practical difficulty of integrating these materials into manufacturing processes. Extremely low-k dielectrics typically have large pores and high overall porosity. These properties make the extremely low-k dielectric layers susceptible to intrusion and damage during high energy plasma etching, particularly when the etch gas includes oxygen. Etch damage can reduce device reliability and offset the gains in RC performance achieved by switching from low-k to extremely low-k dielectrics. There has been a long felt need for a process that economically incorporates extremely low-k dielectrics into semiconductor devices in a way that produces reliable devices with reduced RC delay.

SUMMARY

The present disclosure provides a method of forming a dual damascene metal interconnect for a semiconductor device. The method includes forming a first dielectric layer, forming vias through that layer, depositing a sacrificial layer over the first dielectric layer, and forming trenches through the sacrificial layer. If the sacrificial layer is deposited after the vias are formed and material of the sacrificial layer enters the vias, the sacrificial material is removed from the vias. The vias and trenches are then filled with metal. The sacrificial layer is then removed. A second dielectric layer is then formed over the first dielectric layer so as to fill between the metal-filled trenches. The second dielectric layer differs from the first dielectric layer in one or more of: the second dielectric layer has a lower effective dielectric constant, the second dielectric layer has a higher porosity, and the second dielectric layer has air gaps. The method allows the formation of an extremely low-k dielectric layer for the second level of the dual damascene structure while avoiding damage to that layer by such processes as trench etching and trench metal deposition.

The present disclosure also provides dual damascene metal interconnect structures that can be formed by the foregoing process and semiconductor devices including those structures. A first layer of the dual damascene structure includes metal-filled vias in a field of a first dielectric. A second layer of the dual damascene structure includes metal-filled trenches in a field of a second dielectric. The first and second layer dielectrics are different. The dual damascene structure is further characterized by the absence of an etch stop layer between the first and second layer dielectrics. The structure can further have one or more of the following characteristics, which can be distinctive: air gaps in the second dielectric layer, but not the first dielectric layer; an effective dielectric constant of less than 2.1 for the second dielectric layer, but not the first dielectric layer; a porosity of 20% or more for the second dielectric layer, but not the first dielectric layer; the absence of etch damage in the second dielectric layer, and the metal filling the trenches and vias being a copper-based metal.

The primary purpose of this summary has been to present certain of the inventors' concepts in a simplified form to facilitate understanding of the more detailed description that follows. This summary is not a comprehensive description of every one of the inventors' concepts or every combination of the inventors' concepts. Other concepts of the inventors will be conveyed to one of ordinary skill in the art by the following detailed description together with the drawings. The specifics disclosed herein may be generalized, narrowed, and combined in various ways with the ultimate statement of what the inventors claim as their invention being reserved for the claims that follow.

BRIEF DESCRIPTION OF THE DRAWINGS

FIG. 2 illustrates an exemplary starting point for forming a dual damascene structure according to the present disclosure.

FIG. 3 illustrates the structure of FIG. 2 following the formation of a metal capping layer.

FIG. 4 illustrates the structure of FIG. 3 following formation of a first dielectric layer.

FIG. 5 illustrates the structure of FIG. 4 following formation of a patterned mask over the first dielectric layer and etching to form vias through the first dielectric layer, and removing the mask.

FIG. 6 illustrates the structure of FIG. 5 following formation of a sacrificial layer.

FIG. 7 illustrates the structure of FIG. 6 following formation and patterning of a hard mask over the sacrificial layer.

FIG. 8 illustrates the structure of FIG. 7 following etching to form trenches through the sacrificial layer and removing the sacrificial material from the vias.

FIG. 9 illustrates the structure of FIG. 8 following filling the vias and trenches with metal.

DETAILED DESCRIPTION

Figure 1:
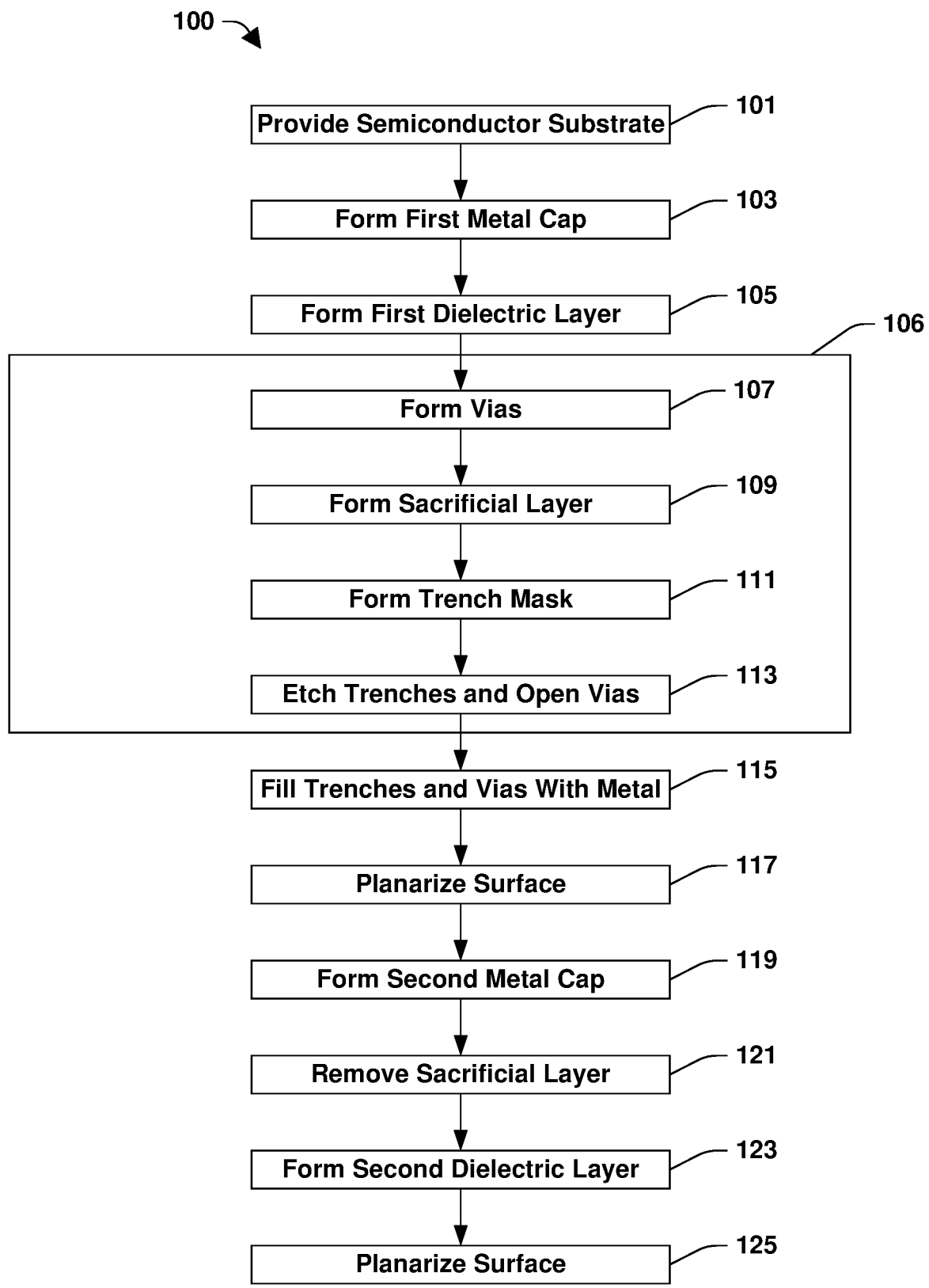
FIG. 1 provides an exemplary process of the present disclosure.

FIG. 1 provides an exemplary sequence of steps for a process 100 of forming a dual damascene structure 225. FIG. 2 through 13 illustrate a substrate 200 as it progresses through this process. The process 100 begins with step 101, which is providing the substrate 200, which is a semiconductor device at an intermediate stage of manufacture. The substrate 200 includes a semiconductor 201 and one or more device structures formed during front-end of line (FEOL) processing. Process 100 adds a dual damascene metal interconnect 225 to the substrate 200.

The dual damascene structure 225 is formed over a region of the substrate 200 that can include both nMOS and pMOS regions. Examples of semiconductors include, without limitation, silicon, silicon on insulator (SOI), Ge, SiC, GaAs, GaAlAs, InP, GaN SiGe. Device structures formed during FEOL processing can include, without limitation, memory devices, logical devices, FETs and components thereof such as source regions, drain regions, and gate electrodes, active devices, passive devices, and combinations thereof. The substrate 200 can also include insulators, conductors, and previously formed interconnect structures, including structures formed during earlier stages of back-end of line (BEOL) processing. The substrate 200 includes terminals 203. The dual damascene structure formed by process 100 will include vias 209 for contact with the terminals 203, as will be more fully appreciated below.

Step 103 is an optional step of forming a metal cap layer 205 on terminals 203. The cap layer 205 can include one or more layers. The cap layer can provide one or more of the following functionalities: protecting the underlying material from damage during subsequent processing, providing an interface between the damascene metal 217 to be formed and metal of terminals 203, providing a diffusion barrier, and preventing electromigration. Examples of cap layer materials include, without limitation, tungsten (W), cobalt (Co), cobalt tungsten phosphide (CoWP), and cobalt tungsten borate (CoWB). A cobalt-containing cap layer 205 is particularly desirable in terms of preventing electromigration and reducing RC-delay. Cap layer 205 can be formed by any suitable process or combination of processes. An electroless plating (autocatalytic) process can be effective to provide the cap layer 205 only on the terminals 203 and not other surfaces of the substrate 200.

Step 105 of FIG. 1 is forming a first dielectric layer 207, which is generally a low-k dielectric layer. Any suitable dielectric can be used. Examples of low-k dielectrics that may be suitable for the first dielectric layer 207 include organosilicate glasses (OSG) such as carbon-doped silicon dioxide, fluorine-doped silicon dioxide (otherwise referred to as fluorinated silica glass (or FSG), and organic polymer low-k dielectrics. Examples of organic polymer low-k dielectrics include polyarylene ether, polyimide (PI), benzocyclbbutene, and amorphous polytetrafluoroethylene (PTFE). The first dielectric layer 207 can be formed by any suitable process, with suitability depending on the material being used. Examples of processes for depositing the first dielectric layer 207 include spin-on and CVD processes.

Dielectric layers have an effective dielectric constant that is a function of the dielectric used in the layer and the physical structure of the layer. Introducing porosity and air-gaps into a dielectric layer reduces the effective dielectric constant of a layer, however, porosity and air-gaps also make layers structurally weaker and more susceptibility to etch damage. In view of these later considerations, the first dielectric layer 207 has a porosity less than 20% in one embodiment and is formed without air gaps in one embodiment. Porosity is void space that is distributed throughout the dielectric material forming the dielectric layer, whereas air gaps are larger voids in the layer space otherwise filled by the dielectric material. Air gaps relate to the geometry of a layer and include the voids that form in corners and other recesses when a dielectric layer is deposited by a non-conformal deposition process.

Low porosity and the absence of air gaps generally mean that the first dielectric layer 207 has an effective dielectric constant of at least about 2.1. A first dielectric layer 207 with a dielectric constant in the range from about 2.4 to 3.5 can generally be achieved without excessively compromising the structural stability the resulting dual damascene structure 225. A dielectric constant in the lower end of that range is desirable for providing the resulting dual damascene structure 225 with low capacitance. The first dielectric layer 207 will generally have an effective dielectric constant that is less than 2.9, typically being close to 2.4.

Step 107 is forming vias 209 through the first dielectric layer 207. Vias 209 are typically formed by a process that includes photolithography and an anisotropic high energy plasma etch, for example. Photolithography typically includes coating the substrate with a photoresist, selectively exposing the photoresist according to a desired via pattern, developing the photoresist, and using the photoresist as an etch mask for etching out the vias 209 or for etching a hard mask that becomes the etch mask for etching out the vias 209.

If a hard mask is formed directly over the first dielectric layer 207, it is removed before further processing in one embodiment. A hard mask can significantly increase capacitance as would an etch stop layer. Avoiding the use of a hard mask is generally easier than removing the hard mask and reduces contamination and damage to the first dielectric layer 207. For example, an OSG dielectric can generally be etched using a patterned photoresist as the etch mask. The photoresist can be removed from the first dielectric layer 207 by a non-damaging plasma etch or a wet process.

Step 109 is forming a sacrificial layer 211 over the first dielectric layer 207. Any suitable material can be used for the sacrificial layer 211. Ease of removal is one factor to be considered in making a selection. Another consideration is the ease of identifying and applying an etch process that removes the sacrificial material preferentially over the material of the first dielectric layer 207. The sacrificial layer 211 can be a material that decomposes and/or vaporizes by thermal treatment at a temperature between about 250° C.

and about 450° C., by UV treatment, or by a combinations of those treatments. Examples of such materials include polymers such as polyimide (PI), polypropylene glycol (PPG), polybutadine (PB), polyethylene glycol (PEG) and polycaprolactonediol (PCL). Amorphous carbon is usually a suitable material for the sacrificial layer 211. Amorphous carbon can generally be removed by an etch process that does little or no damage to the first dielectric layer 207.

Steps 111 and 113 form trenches 215 through the sacrificial layer 211. This typically includes photolithography. Step 111 is forming a mask 213. The mask 213 can be a photoresist or a hard mask. A hard mask is made by forming a layer of hard mask material, forming a photoresist layer over the hard mask layer, selectively exposing the photoresist according to a desired trench pattern, developing the photoresist, using the patterned photoresist to etch the trench pattern through the hard mask layer to form a patterned hard mask 213, and using the patterned hard mask 213 to limit a high energy plasma etch to a desired pattern for trenches 215.

The trenches 215 can be etched through the mask 213 by any suitable process. A suitable process can include one or more steps. For example, a non-selective etch or an etch process showing only limited selectivity between the sacrificial layer material and the material of the first dielectric layer 207 can be used to etch the trenches part, most, or all of the way through the sacrificial layer 211. For example, a non-selective etch can be used until the dielectric layer 207 is exposed. As the dielectric layer 207 becomes exposed, it can be desirable to alter the etch chemistry and slow the etch process in order to avoid damaging the dielectric layer 207. Using the non-selective or less selective etch process initially can accelerate the overall etch.

On the other hand, it can be suitable and convenient to use a single etch process for the entirety of step 113. For example, where the sacrificial layer 211 is formed of amorphous carbon and the dielectric layer 207 is OSG, a selective process can be a high energy plasma etch using $N_2$ and $H_2$ or $NH_3$ in the etch gas. Using a single etch for the entire step 113 has advantages such as ease of application and consistency of results.

Step 113 includes opening the vias 209. If the vias 209 were etched prior to forming the sacrificial layer 211, the vias 209 will generally be filled with the material of the sacrificial layer 211. If via formation is postponed until after the sacrificial layer 211 is formed, then opening the vias 209 is excluded from step 113. When the vias 209 are filled with material of the sacrificial layer 211, it is can be convenient to remove that material as a continuation of the trench etch process. The etch conditions can be maintained throughout the etch or varied as the etch progresses. The etch conditions can be varied as described above or just as the etch nears its final stages and the metal caps 205 become exposed. Even where etch conditions vary, the entire process can generally be carried out in one etch chamber, which reduces processing time.

Step 115 is filling the vias 209 and the trenches 215 with conductive metal 217. The conductive metal 217 can be, for example, Cu, Al, Au, Ag, W, and alloys thereof. The metal 217 can be provided as multiple layers having varying composition. The metal 217 can be filled by any suitable process. Suitable processes can include electroless plating, electroplating, sputter deposition, and chemical vapor deposition (CVD).

While the metal 217 can be any suitable metal or combination of metals, the processes of the present disclosure are particularly adapted to the use of copper (Cu). As used herein to describe the metal that fills the vias 209 and the trenches 215, copper includes pure copper, copper containing trace impurities, and alloys that are mostly copper. Copper can be alloyed with small amounts of elements such as tantalum, indium, tin, zinc, manganese, chromium, titanium, germanium, strontium, platinum, magnesium, aluminum or zirconium. Copper provides lower resistance but is incompatible with many prior art processes.

Electroless plating of copper generally includes forming a copper seed layer followed by autocatalytic copper deposition. Examples of seed layer materials include, without limitation, copper (Cu), nickel (Ni), gold (Au), silver (Ag), palladium (Pd), Iridium (In), nickel-palladium-gold (NiPdAu), and nickel-gold (NiAu). The seed layer can be formed by any suitable process. The seed layer can be formed itself by electroless deposition, sputtering, or chemical vapor deposition.

Before filling with copper or the like, trenches 215 and vias 209 are generally lined with a barrier that prevents electromigration. Examples of materials for the barrier layer include ruthenium (Ru), manganese (Mn), cobalt (Co), and chromium (Cr), titanium nitride (TiN), titanium tungsten (TiW), tantalum (Ta), tantalum nitride (TaN), tungsten nitride (WN), and combinations thereof. The barrier layer can be deposited by any suitable process, such as CVD deposition.

A layer that promotes adhesion can be included with the barrier layer. An interfacial layer can be a self-assembled monolayer (SAM). A self-assembled monolayer can be formed, for example, by a thermal process treatment that includes an organic chemical-containing gas. Optionally, the self-assembled monolayer forms only on the first dielectric layer 207 and lines vias 209 but not the trenches 215.

Step 115 completes formation of the dual damascene structure 218 shown in FIG. 9. The dual damascene structure 218 includes a first level, which includes metal 217-filled vias 209 in a field of the first dielectric layer 207, and a second level, which includes metal 217-filled trenches 215 in a field of the sacrificial layer 211. Subsequent processing replaces the sacrificial material layer 211 in structure 218 with a second dielectric layer 221.

Step 117 is planarizing an upper surface of the substrate 200. The planarized surface includes sacrificial material 211 with an inlay of metal 217. Planarization is generally accomplished by chemical mechanical polishing (CMP). The surface does not become truly planar, as CMP invariably removes disparate materials at rates that vary at least slightly.

Figure 10:
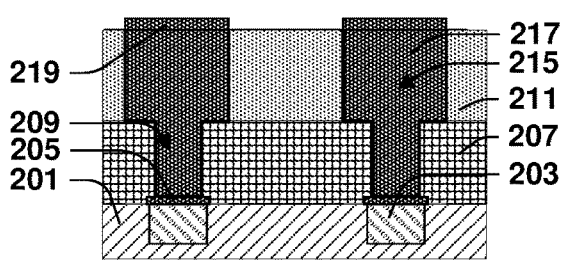
FIG. 10 illustrates the structure of FIG. 9 following chemical-mechanical polishing and forming a second metal cap layer.

Step 119 is an optional step of forming a metal cap 219 on the exposed upper surface of metal 217, as illustrated in FIG. 10. The cap 219 can be the same or different from the cap 203, however, the comments made regarding the cap 203 in terms of composition, process, and functionality apply to the cap 219 as well.

Figure 11:
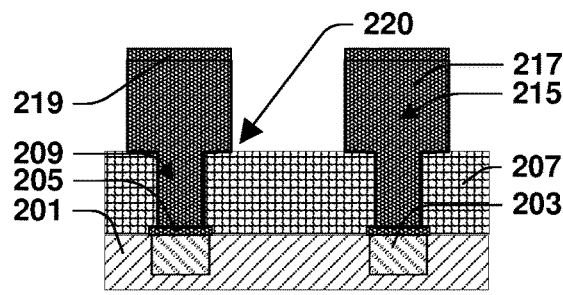
FIG. 11 illustrates the structure of FIG. 10 following removal of the sacrificial layer.
Figure 12:
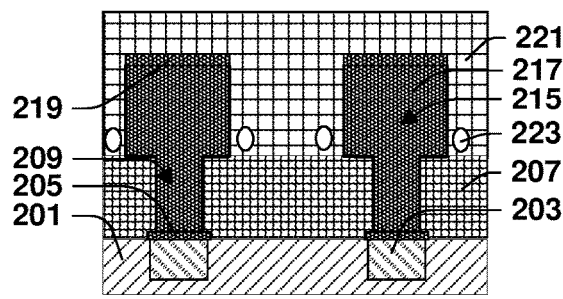
FIG. 12 illustrates the structure of FIG. 11 following deposition of a second dielectric layer.

Step 121 is removing the sacrificial layer 211. The sacrificial layer 211 can be removed by any suitable process. Depending on the material used, it can be possible and desirable to pre-treat the sacrificial layer 211 to facilitate its removal. Examples of pretreatment processes that can be used include oxidation, thermal treatment, and UV irradiation. The removal process itself can be, for example, a wet clean or a plasma etch. Removal of the sacrificial layer 211 leaves the metal 217 of the trenches 215 exposed as illustrated by FIG. 11.

Step 123 is forming a second dielectric layer 221. The second dielectric layer 221 fills in a space previously occupied by the sacrificial layer 211 and forms a field around metal 217 of trenches 215. The second dielectric layer 211 is generally an extremely low-k dielectric layer. In order to have a low dielectric constant, the second dielectric layer 221 can be formed with a porosity of at least 20%. The second dielectric layer 221 can also be formed with air gaps 223. The second dielectric layer 221 can be one that would be damaged by processes used to form trenches 215, to fill trenches 215 with metal 217, or the planarization step 117.

The material of the second dielectric layer 221 can be a low-k dielectric as described above, but with porosity and or air gaps 223 in order to have an effective dielectric constant of 2.1 or less. Air gaps can reduce the dielectric constant of a layer by 5% or more, which is a substantial reduction. Porosity can also substantially reduce the effective dielectric constant of a layer. Porosity can be introduced as part of the process of forming the second dielectric layer 221. For example, an OSG dielectric layer 221 can be formed by applying an OSG precursor to the substrate 200 together with a porogen by a spin-on processed or CVD process. The process may further include controlled evaporation of the porogen. Examples of OSG precursors include organosilanes and organosiloxanses. Examples of organosilanes include methyl silsesquioxane (MSQ) and hydrogen silsesquioxane (HSQ). Examples of organosiloxanes include polymers belonging to the methyl siloxane family such as diethoxymethylsilane. Examples of porogens include organic solvents. The organic solvent can be, for example, toluene, heptane, cyclohexanol, or a mixture thereof. Following a dielectric layer formation process such as spin-on or CVD, pore formation, mechanical strength, or both can be improved by a post-deposition treatment such as thermal, UV or e-beam treatment.

Air gaps 223 can also be introduced into the second dielectric layer 221 by choosing a suitable formation process. A suitable process for forming dielectric layer 221 with air gaps 223 can be a non-conformal deposition process such as plasma enhanced chemical vapor deposition (PECVD). Non-conformal processes creates air-gaps 223 in recessed areas such as the corner 220 identified in FIG. 11. An exemplary non-conformal deposition process is plasma-enhanced CVD. An OSG layer with porosity greater than 20% and air gaps 223 can have an effective dielectric constant that is 2.0 or less.

Step 125 is another planarization step and is also generally accomplished with chemical mechanical polishing (CMP). Step 125 planarizes an upper surface of the second dielectric layer 221 an upper surface of the cap metal 219 or an upper surface of the trench metal 217 if cap 219 is not present. Optionally, the pore structure of the second dielectric layer 221 is infiltrated with a protective "stuffing" material prior to planarization. The stuffing material can be removed after planarization. A stuffing material can be, for example, a monomeric hydrocarbon. Such a material can be transported into the pores of dielectric layer 221 by a carrier fluid, such as super critical carbon dioxide.

Figure 13:
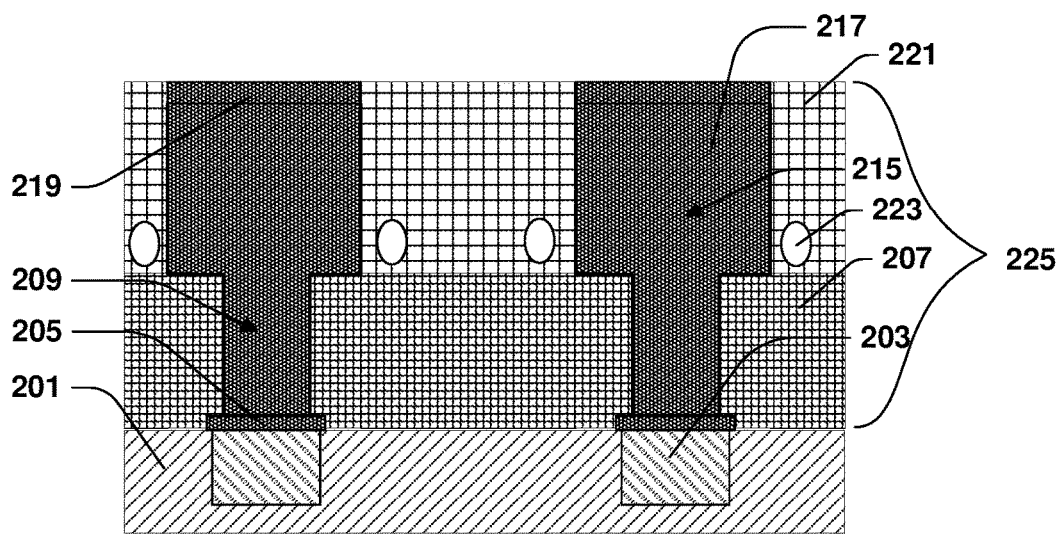
FIG. 13 illustrates the structure of FIG. 12 following chemical mechanical polishing.

FIG. 13 illustrates the substrate 200 with a dual damascene structure 225 formed by the process 100. The dual damascene structure 225 includes a first level, which includes metal 217-filled vias 209 in a field of the first dielectric layer 207, and a second level, which includes metal 217-filled trenches 215 in a field of the second dielectric layer 221. One characteristic of the dual damascene structure 225 is the absence of an etch stop layer. Another characteristic is the absence of etch damage in the second dielectric layer 221. The first dielectric layer 207 is a low-k dielectric with porosity less than 20% and without air gaps. The first dielectric layer 207 provides mechanical strength and stability to the structure 225. The second dielectric layer 221 is an extremely low-k dielectric with porosity greater than 20% and contains air gaps 223. The second dielectric layer 221 provides the structure 225 with low capacitance.

The order of steps 107, 109, 111, and 113 of the process 100 can vary from the sequence 106 shown in FIG. 1 while still producing a dual damascene structure 225 structure as shown by FIG. 13. In particular, step 107, forming the vias 209, can be postponed until after step 109, forming the sacrificial layer 211.

Figure 14:
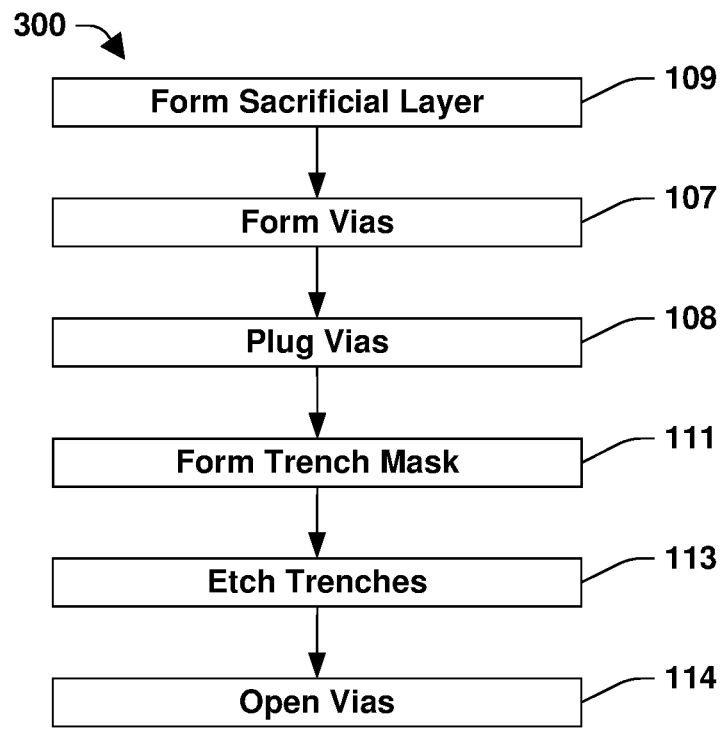
FIG. 14 provides an alternate sequence for steps 106 of the process of FIG. 1.
Figure 15:
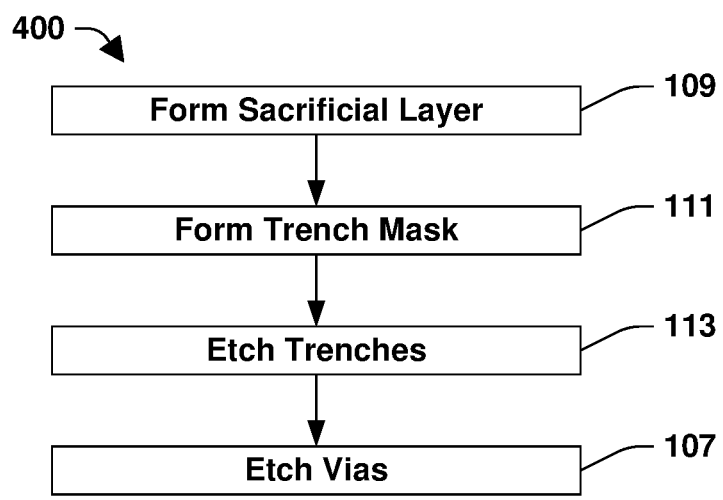
FIG. 15 provides another alternate sequence for steps 106 of the process of FIG. 1.

FIGS. 14 and 15 show two alternative sequences 300 and 400. In sequences 300 and 400, the via etch 107 is postponed until after step 109, forming the sacrificial layer 211. In these sequences material of the sacrificial layer 211 does not fill the vias 209 and is not etched from the vias 209 during the trench etch 113.

In sequence 300, the via etch 107 is carried out before the trench etch 113. The via etch 113 in sequence 300 includes etching through the sacrificial layer 211 and then through the first dielectric layer 207. In the process 300, it can be desirable to include the optional step step 108, which plugs the vias 109 in order to provide a level surface on which to form the trench etch mask 213. The plug material can be removed from the vias 109 during the trench etch 113, or in a separate step 114 that follows the trench etch 113. In sequence 400, the trench etch 113 is carried out prior to the via etch 107.

Each of the process sequences 106, 300, and 400 provides advantages in comparison to the others. The sequence 106 provides better control over the dimensions of vias 209 in comparison to sequences 300 and 400. Sequences 300 and 400 improve over sequence 106 in that they avoid possible contamination of the first dielectric layer 207 that can occur when a via etch mask is formed directly on layer 207. The sequence 300 is more tolerant of misalignment between the trench and via masks than the sequence 400. On the other hand, the sequence, sequence 300 requires that the vias 209 be etched with a high aspect ratio in comparison to the process 400.

The disclosure as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one disclosure and the following claims do not necessarily encompass every concept, aspect, embodiment, or example described herein.

The invention claimed is:

1. A semiconductor device, comprising:
   a semiconductor substrate;
   a dielectric structure arranged over the semiconductor substrate;
   first and second metal vias disposed in the dielectric structure and spaced laterally apart from one another;
   first and second metal lines disposed in the dielectric structure and having nearest neighboring sidewalls that are spaced laterally apart from one another by a portion of the dielectric structure, wherein the nearest neighboring sidewalls include a first sidewall and a second sidewall, wherein the portion of the dielectric structure extends continuously from the first sidewall to the second sidewall, the first and second metal lines contacting upper portions of the first and second metal vias, respectively; and first and second air gaps disposed in the portion of the dielectric structure, the first and second air gaps being proximate to the nearest neighboring sidewalls of the first and second metal lines, respectively.

2. The semiconductor device of claim 1, wherein a plane bisects the portion of the dielectric structure such that the nearest neighboring sidewalls of the first and second metal lines are equally spaced from the plane and on opposite sides of the plane, and the first and second air gaps are arranged between the plane and the nearest neighboring sidewalls of the first and second metal lines, respectively.

3. A semiconductor device, comprising:
a semiconductor substrate;
a dielectric structure arranged over the semiconductor substrate;
first and second metal vias disposed in the dielectric structure and spaced laterally apart from one another;
first and second metal lines disposed in the dielectric structure and having nearest neighboring sidewalls that are spaced laterally apart from one another by a portion of the dielectric structure, the first and second metal lines contacting upper portions of the first and second metal vias, respectively; and
first and second air gaps disposed in the portion of the dielectric structure, the first and second air gaps being proximate to the nearest neighboring sidewalls of the first and second metal lines, respectively; and
wherein the first metal via and the first metal line are a first continuous metal structure and wherein the second metal via and the second metal line are a second continuous metal structure, and wherein the first metal line laterally overhangs the first metal via on both sides by a same amount.

4. The semiconductor device of claim 3, further comprising:
a barrier layer lining sidewalls of the first metal line and sidewalls of the first metal via to separate the first continuous metal structure from the dielectric structure.

5. The semiconductor device of claim 1, wherein the dielectric structure includes a first dielectric layer laterally surrounding the first and second metal vias and a second dielectric layer laterally surrounding the first and second metal lines, the first dielectric layer having a first composition and the second dielectric layer having a second composition that differs from the first composition.

6. The semiconductor device of claim 5, wherein the first dielectric layer has a porosity less than 20% and the second dielectric layer has a porosity greater than 20%.

7. A semiconductor device, comprising:
a semiconductor substrate;
a dielectric structure arranged over the semiconductor substrate;
first and second metal vias disposed in the dielectric structure and spaced laterally apart from one another;
first and second metal lines disposed in the dielectric structure and having nearest neighboring sidewalls that are spaced laterally apart from one another by a portion of the dielectric structure, the first and second metal lines contacting upper portions of the first and second metal vias, respectively; and
first and second air gaps disposed in the portion of the dielectric structure, the first and second air gaps being proximate to the nearest neighboring sidewalls of the first and second metal lines, respectively, wherein a top surface of the first and second air gaps is below a top surface of the first and second metal lines;
a first metal cap layer disposed in a lowermost portion of the dielectric structure, the first metal cap layer having outermost sidewalls spaced apart by a first distance; and
a second metal cap layer disposed in an uppermost portion of the dielectric structure, the second metal cap layer having a metal composition that differs from that of the first and second metal lines.

8. The semiconductor device of claim 5, wherein first and second air gaps each is closer to a bottom surface of the second dielectric layer than a top surface of the second dielectric layer.

9. The semiconductor device of claim 5, wherein:
the first dielectric layer has an effective dielectric constant greater than 2.1 and less than 3.5; and
the second dielectric layer has an effective dielectric constant less than 2.1.

10. The semiconductor device of claim 1, further comprising:
a first metal cap layer contacting a lower portion of the first metal via, the first metal cap layer having outermost sidewalls spaced apart by a first distance;
wherein the first metal via has outermost sidewalls spaced apart by a second distance less than the first distance; and
wherein the first metal line has outermost sidewalls spaced apart by a third distance, wherein the third distance is greater than the second distance and is greater than the first distance.

11. The semiconductor device of claim 10, further comprising:
a second metal cap layer contacting an upper surface of the first metal line, the second metal cap layer having outermost sidewalls spaced apart by a fourth distance, the second metal cap layer having a metal composition that differs from the first metal line.

12. The semiconductor device of claim 5, further comprising:
a first metal cap layer disposed in a lower portion of the first dielectric layer, the first metal cap layer having outermost sidewalls spaced apart by a first distance;
a conductive via disposed in an upper portion of the first dielectric layer and contacting an upper portion of the first metal cap layer, the conductive via having outermost sidewalls spaced apart by a second distance less than the first distance; and
a conductive line disposed in the second dielectric layer and contacting an upper portion of the conductive via, the conductive line having outermost sidewalls spaced apart by a third distance, wherein the third distance is greater than the second distance and is greater than the first distance.

13. The semiconductor device of claim 3, wherein a plane bisects the portion of the dielectric structure such that the nearest neighboring sidewalls of the first and second metal lines are equally spaced from the plane and on opposite sides of the plane, and the first and second air gaps are arranged between the plane and the nearest neighboring sidewalls of the first and second metal lines, respectively.

14. The semiconductor device of claim 7, wherein a plane bisects the portion of the dielectric structure such that the nearest neighboring sidewalls of the first and second metal lines are equally spaced from the plane and on opposite sides of the plane, and the first and second air gaps are arranged between the plane and the nearest neighboring sidewalls of the first and second metal lines, respectively.

15. The semiconductor device of claim 3, wherein the dielectric structure includes a first dielectric layer laterally surrounding the first and second metal vias and a second dielectric layer laterally surrounding the first and second metal lines, the first dielectric layer having a first composition and the second dielectric layer having a second composition that differs from the first composition.

16. The semiconductor device of claim 7, wherein the dielectric structure includes a first dielectric layer laterally surrounding the first and second metal vias and a second dielectric layer laterally surrounding the first and second metal lines, the first dielectric layer having a first composition and the second dielectric layer having a second composition that differs from the first composition.

17. The semiconductor device of claim 16, wherein the first dielectric layer has a porosity less than 20% and the second dielectric layer has a porosity greater than 20%.

18. The semiconductor device of claim 7, wherein first and second air gaps each is closer to bottom surfaces of the first and second metal lines than top surfaces of the first and second metal lines.

19. The semiconductor device of claim 3, wherein the dielectric structure includes a first dielectric layer laterally surrounding the first and second metal vias and a second dielectric layer laterally surrounding the first and second metal lines, the first dielectric layer having a first composition and the second dielectric layer having a second composition that differs from the first composition; and further comprising:
  a first metal cap layer disposed in a lower portion of the first dielectric layer, the first metal cap layer having outermost sidewalls paced apart by a first distance;
  a conductive via disposed in an upper portion of the first dielectric layer and contacting an upper portion of the first metal cap layer, the conductive via having outermost sidewalls spaced apart by a second distance less than the first distance; and
  a conductive line disposed in the second dielectric layer and contacting an upper portion of the conductive via, the conductive line having outermost sidewalls spaced apart by a third distance, wherein the third distance is greater than the second distance and is greater than the first distance.

20. The semiconductor device of claim 7, wherein the dielectric structure includes a first dielectric layer laterally surrounding the first and second metal vias and a second dielectric layer laterally surrounding the first and second metal lines, the first dielectric layer having a first composition and the second dielectric layer having a second composition that differs from the first composition; and further comprising:
  a conductive via disposed in an upper portion of the first dielectric layer and contacting an upper portion of the first metal cap layer, the conductive via having outermost sidewalls spaced apart by a second distance less than the first distance; and
  a conductive line disposed in the second dielectric layer and contacting an upper portion of the conductive via, the conductive line having outermost sidewalls spaced apart by a third distance, wherein the third distance is greater than the second distance and is greater than the first distance.

\* \* \* \* \*